(12) United States Patent
Masuoka et al.

(10) Patent No.: US 8,754,481 B2
(45) Date of Patent: Jun. 17, 2014

(54) SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP); Shintaro Arai, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 29 days.

(21) Appl. No.: 13/654,745

(22) Filed: Oct. 18, 2012

(65) Prior Publication Data
US 2013/0228869 A1 Sep. 5, 2013

Related U.S. Application Data

(60) Provisional application No. 61/548,368, filed on Oct. 18, 2011.

(51) Int. Cl.
*H01L 27/088* (2006.01)
(52) U.S. Cl.
USPC .......................................................... 257/368
(58) Field of Classification Search
USPC ......... 257/135–139, 220, 225, 242, 260–263, 257/278, 296–300, 302, 314, 328, 390, 257/E27.075–E27.077, E27.084–E27.104, 257/E29.17, E29.309, E29.33, E21.209, 257/E21.526, E21.613, E21.645–E21.646, 257/E21.66–E21.667, E21.677–E21.691
See application file for complete search history.

(56) References Cited

U.S. PATENT DOCUMENTS

| 8,018,785 B2 | 9/2011 | Yabuuchi et al. |
| 2010/0219483 A1 | 9/2010 | Masuoka et al. |
| 2011/0024828 A1* | 2/2011 | Takeuchi ...................... 257/329 |

FOREIGN PATENT DOCUMENTS

| JP | H0271556 U | 5/1990 |
| JP | 2188966 A | 7/1990 |
| JP | 3145761 A | 6/1991 |
| JP | 2008-065968 A | 3/2008 |
| JP | 2008205168 A | 9/2008 |
| WO | 2009/060934 A1 | 5/2009 |
| WO | 2009/096465 A1 | 8/2009 |

OTHER PUBLICATIONS

Kawasaki, H, et al., "Demonstration of Highly Scaled FinFET SRAM Cells with High-K/Metal Gate and Investigation of Characteristic Variability for the 32 nm node and beyond", Dec. 15-17, 2008, pp. 237-240, IEEE International Electron Devices Meeting.

* cited by examiner

*Primary Examiner* — Fernando L Toledo
*Assistant Examiner* — Lawrence-Linh T Nguyen
(74) *Attorney, Agent, or Firm* — Laurence A. Greenberg; Werner H. Stemer; Ralph E. Locher

(57) ABSTRACT

An SGT-based static memory cell which is a six-transistor SRAM cell includes an SGT driver transistor including a first gate electrode surrounding a first gate insulating film and composed of at least a metal; an SGT selection transistor including a second gate electrode surrounding a second gate insulating film and composed of at least a metal; an SGT load transistor including a third gate electrode surrounding a third gate insulating film and composed of at least a metal; and a gate wire connected to the second gate electrode. An island-shaped semiconductor layer of the driver transistor has a peripheral length that is less than twice that of an island-shaped semiconductor layer of the selection transistor. A voltage applied to the second gate electrode is lower than a voltage applied to a first-conductivity-type high-concentration semiconductor layer on the upper part of the island-shaped semiconductor layer of the selection transistor.

5 Claims, 10 Drawing Sheets

SEMICONDUCTOR DEVICE

CROSS REFERENCE TO RELATED APPLICATION

This application claims the priority, under 35 U.S.C. §119 (e), of provisional application No. 61/548,368, filed Oct. 18, 2011; the prior application is herewith incorporated by reference in its entirety.

BACKGROUND OF THE INVENTION

Field of the Invention

The present invention relates to a semiconductor device.

The degree of integration of semiconductor integrated circuits, namely, integrated circuits using metal oxide semiconductor (MOS) transistors, has been increasing. The increasing degree of integration of such integrated circuits results in the MOS transistors used in the integrated circuits having small sizes reaching nano-scale dimensions. Inverter circuits are fundamental circuits of digital circuits, and the increasing decrease in the size of MOS transistors included in inverter circuits causes difficulty in suppressing leak currents, leading to problems of reduced reliability due to hot carrier effects and of the reduction in the area occupied by the circuits being prevented because of the requirements of the secure retention of necessary currents. To overcome the above problems, a surrounding gate transistor (SGT) having a structure in which a source, gate, and drain are arranged vertically with respect to a substrate and in which the gate surrounds an island-shaped semiconductor layer has been proposed (for example, Japanese Unexamined Patent Application Publication Nos. 2-71556, 2-188966, and 3-145761).

It is known that in a static memory cell, operational stability is ensured by making the current driving force of a driver transistor twice the current driving force of an access transistor (H. Kawasaki, M. Khater, M. Guillorn, N. Fuller, J. Chang, S. Kanakasabapathy, L. Chang, R. Muralidhar, K. Babich, Q. Yang, J. Ott, D. Klaus, E. Kratschmer, E. Sikorski, R. Miller, R. Viswanathan, Y. Zhang, J. Silverman, Q. Ouyang, A. Yagishita, M. Takayanagi, W. Haensch, and K. Ishimaru, "Demonstration of Highly Scaled FinFET SRAM Cells with High-κ/Metal Gate and Investigation of Characteristic Variability for the 32 nm node and beyond", IEDM, pp. 237-240, 2008).

To construct a static memory cell with the SGTs described above, the gate width needs to be doubled to realize making the current driving force of a driver transistor twice the current driving force of an access transistor to ensure operational stability, and therefore two driver transistors need to be used. This leads to an increase in memory cell area. Alternatively, it is necessary to double the diameter of a silicon pillar or to shape a silicon pillar into a quadrilateral with long sides doubled in order to double the gate width, resulting in an increase in the area occupied by the driver transistor. This also leads to an increase in memory cell area.

SUMMARY OF THE INVENTION

Accordingly, provided is an SGT-based static memory cell with a high degree of integration and operational stability ensured.

A static memory cell according to an aspect of the present invention is a six-transistor static random access memory (SRAM) cell including a first driver transistor, a first selection transistor, a first load transistor, and a first gate wire. The first driver transistor includes a first island-shaped semiconductor layer, a first first-conductivity-type high-concentration semiconductor layer formed on the upper part of the first island-shaped semiconductor layer, a second first-conductivity-type high-concentration semiconductor layer formed on the lower part of the first island-shaped semiconductor layer, a first second-conductivity-type semiconductor layer formed between the first first-conductivity-type high-concentration semiconductor layer and the second first-conductivity-type high-concentration semiconductor layer, a first gate insulating film formed surrounding the first second-conductivity-type semiconductor layer, and a first gate electrode formed surrounding the first gate insulating film and composed of at least a metal. The first selection transistor includes a second island-shaped semiconductor layer, a third first-conductivity-type high-concentration semiconductor layer formed on the upper part of the second island-shaped semiconductor layer, a fourth first-conductivity-type high-concentration semiconductor layer formed on the lower part of the second island-shaped semiconductor layer, a second second-conductivity-type semiconductor layer formed between the third first-conductivity-type high-concentration semiconductor layer and the fourth first-conductivity-type high-concentration semiconductor layer, a second gate insulating film formed surrounding the second second-conductivity-type semiconductor layer, and a second gate electrode formed surrounding the second gate insulating film and composed of at least a metal. The first load transistor includes a third island-shaped semiconductor layer, a third second-conductivity-type high-concentration semiconductor layer formed on the upper part of the third island-shaped semiconductor layer, a fourth second-conductivity-type high-concentration semiconductor layer formed on the lower part of the third island-shaped semiconductor layer, a fifth first-conductivity-type semiconductor layer formed between the third second-conductivity-type high-concentration semiconductor layer and the fourth second-conductivity-type high-concentration semiconductor layer, a third gate insulating film formed surrounding the fifth first-conductivity-type semiconductor layer, and a third gate electrode formed surrounding the third gate insulating film and composed of at least a metal. The first gate wire is connected to the second gate electrode. The first island-shaped semiconductor layer has a peripheral length less than twice a peripheral length of the second island-shaped semiconductor layer, and a voltage to be applied to the second gate electrode is lower than a voltage to be applied to the third first-conductivity-type high-concentration semiconductor layer.

The static memory cell may further include a first pass transistor. The first pass transistor includes a fourth island-shaped semiconductor layer, a sixth first-conductivity-type high-concentration semiconductor layer formed on the upper part of the fourth island-shaped semiconductor layer, a seventh first-conductivity-type high-concentration semiconductor layer formed on the lower part of the fourth island-shaped semiconductor layer, a fifth second-conductivity-type semiconductor layer formed between the sixth first-conductivity-type high-concentration semiconductor layer and the seventh first-conductivity-type high-concentration semiconductor layer, a fourth gate insulating film formed surrounding the fifth second-conductivity-type semiconductor layer, and a fourth gate electrode formed surrounding the fourth gate insulating film and composed of at least a metal. The seventh first-conductivity-type high-concentration semiconductor layer and the first gate wire may be connected to each other via a wiring, and a power supply voltage may be applied to the sixth first-conductivity-type high-concentration semiconductor layer. In addition, a voltage lower than the power supply voltage may be output to the seventh first-conductivity-type high-concentration semiconductor layer.

The static memory cell may further include a first pass transistor. The first pass transistor includes a fourth island-shaped semiconductor layer, a sixth first-conductivity-type high-concentration semiconductor layer formed on the upper part of the fourth island-shaped semiconductor layer, a seventh first-conductivity-type high-concentration semiconductor layer formed on the lower part of the fourth island-shaped semiconductor layer, a fifth second-conductivity-type semiconductor layer formed between the sixth first-conductivity-type high-concentration semiconductor layer and the seventh first-conductivity-type high-concentration semiconductor layer, a fourth gate insulating film formed surrounding the fifth second-conductivity-type semiconductor layer, and a fourth gate electrode formed surrounding the fourth gate insulating film and composed of at least a metal. The sixth first-conductivity-type high-concentration semiconductor layer and the first gate wire may be connected to each other via a wiring, and a power supply voltage may be applied to the seventh first-conductivity-type high-concentration semiconductor layer. In addition, a voltage lower than the power supply voltage may be output to the sixth first-conductivity-type high-concentration semiconductor layer.

In the static memory cell, a voltage to be applied to the fourth gate electrode may be the power supply voltage.

According to an aspect of the present invention, a static memory cell with a high degree of integration and operational stability ensured can be provided, in which when the gate width of a driver transistor is less than twice the gate width of a selection transistor, the voltage to be applied to the gate of the selection transistor is reduced to reduce the current driving force of the selection transistor. Furthermore, an SGT pass transistor is added between a first gate wire and a power supply line, so that the voltage to be applied to the first gate wire can be reduced by a voltage corresponding to a threshold voltage of an SGT. Therefore, the space for a voltage drop circuit can be reduced, and the area occupied by the SGT is only required to implement a voltage drop circuit. That is, a static memory cell with a high degree of integration and operational stability ensured can be provided.

Since SGTs have a body which is completely covered by the gate, in principle, the threshold voltage is not increased due to the back-bias effect. That is, the threshold voltage can always be kept constant. With the use of an SGT as a pass transistor, a static memory cell with operational stability ensured can be provided.

In contrast, bulk MOS field-effect transistors (MOSFETs), silicon-on-insulator (SOI) MOSFETs, double gate MOSFETs, and Tri-gate MOSFETs have a body which is not completely covered by the gate, in principle, the threshold voltage is increased due to the back-bias effect. That is, if a bulk MOSFET, a SOI MOSFET, a double gate MOSFET, or a Tri-gate MOSFET is used as a pass transistor according to the present invention, operational stability is impaired because the threshold voltage changes with the source voltage.

DESCRIPTION OF THE INVENTION

An embodiment of the present invention will be described with reference to the drawings. The present invention is not limited by the following embodiment.

Figure 1:
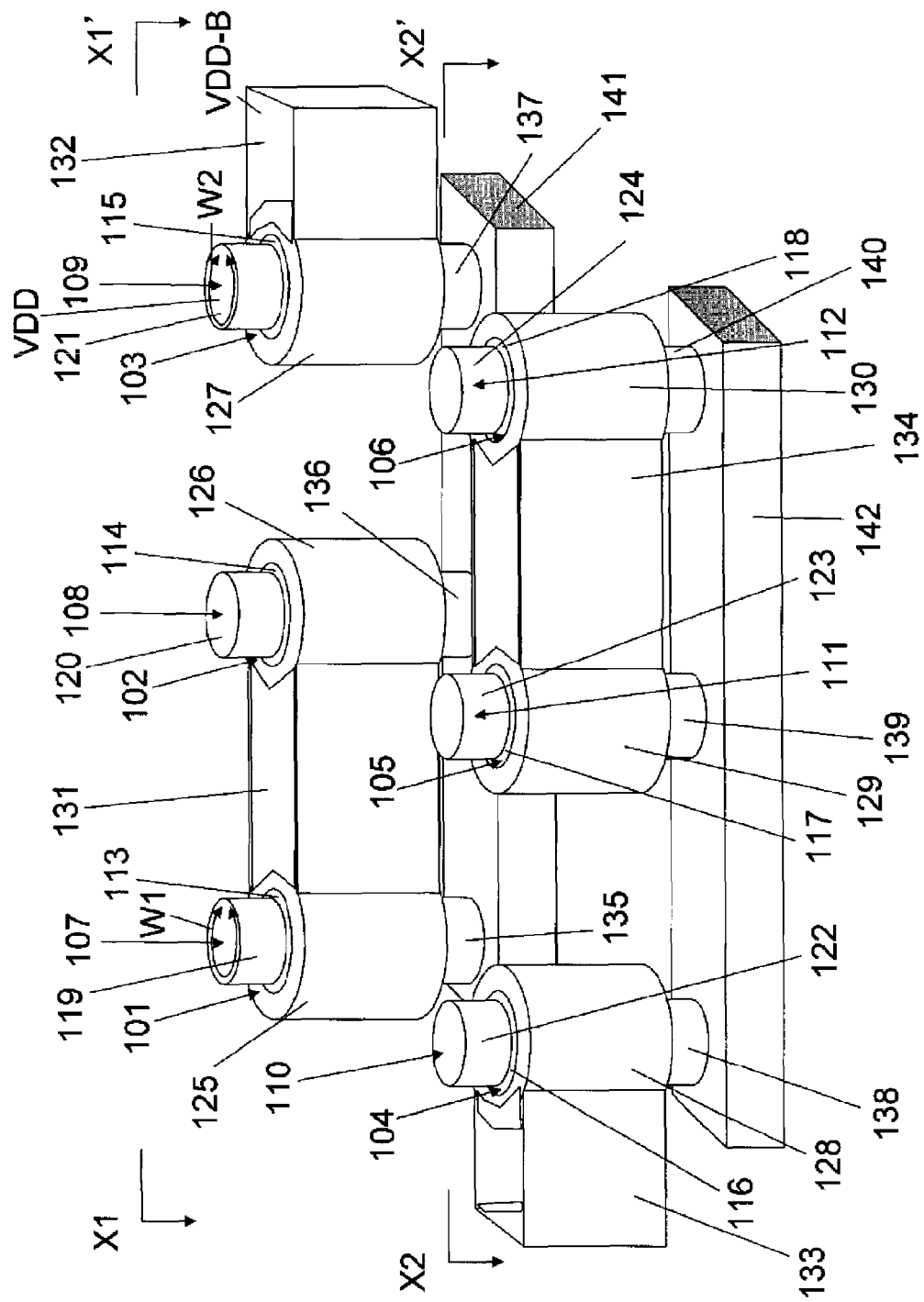
FIG. 1 is an overall view of a static memory cell according to the present invention.
Figure 2:
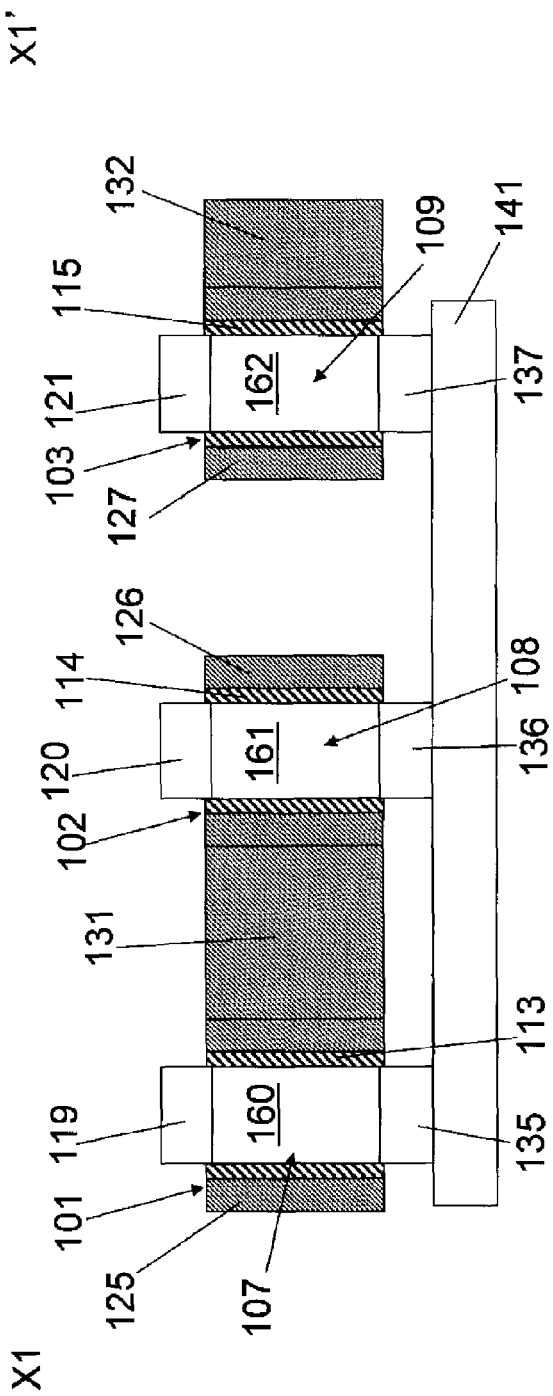
FIG. 2 is a cross-sectional view of the static memory cell according to the present invention, taken along the line X1-X1' in FIG. 1.
Figure 3:
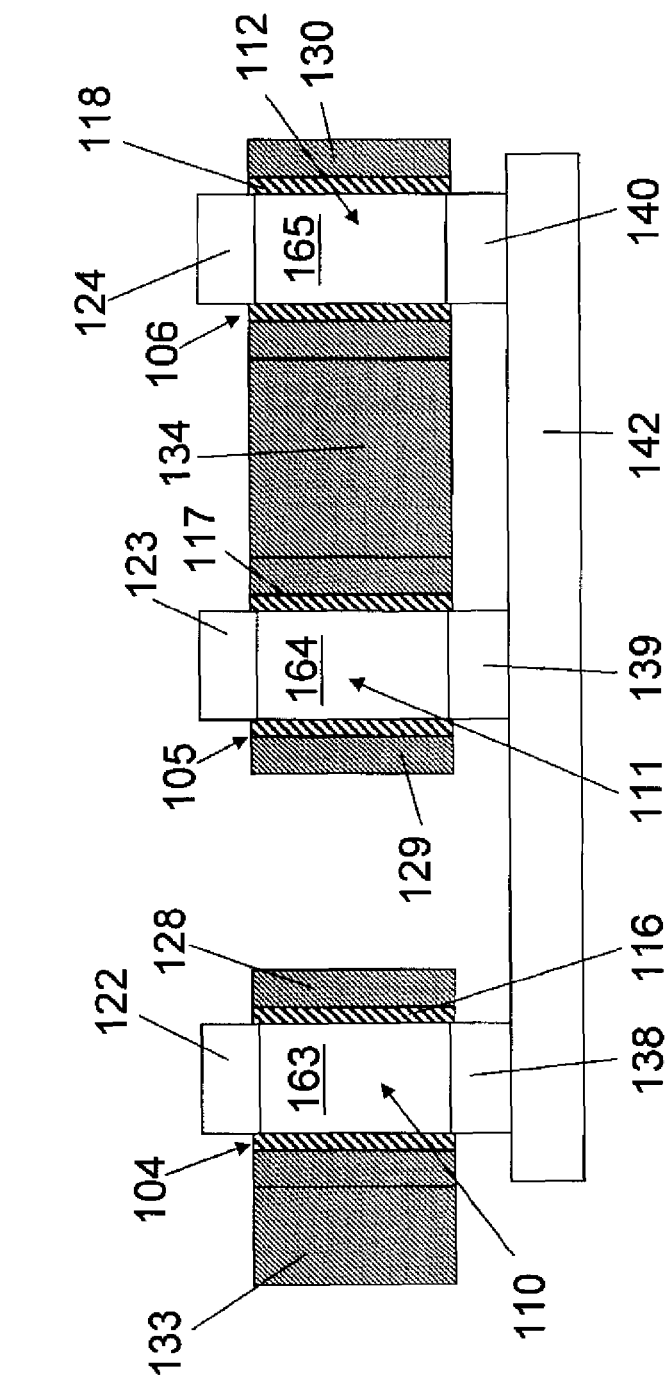
FIG. 3 is a cross-sectional view of the static memory cell according to the present invention, taken along the line X2-X2' in FIG. 1.

Referring now to the figures of the drawing in detail FIG. 1 illustrates an overall view of a static memory cell according to the present invention. FIG. 2 illustrates a cross-sectional view of the static memory cell according to the present invention, taken along the line X1-X1' in FIG. 1. FIG. 3 illustrates a cross-sectional view of the static memory cell according to the present invention, taken along the line X2-X2' in FIG. 1.

The static memory cell includes a first driver transistor 101, and the first driver transistor 101 includes a first island-shaped silicon layer 107, a first n+ silicon layer 119 formed on the upper part of the first island-shaped silicon layer 107, a second n+ silicon layer 135 formed on the lower part of the first island-shaped silicon layer 107, a first p silicon layer 160 formed between the first n+ silicon layer 119 and the second n+ silicon layer 135, a first gate insulating film 113 formed surrounding the first p silicon layer 160, and a first gate electrode 125 formed surrounding the first gate insulating film 113 and composed of at least a metal.

The static memory cell further includes a first selection transistor 103, and the first selection transistor 103 includes a second island-shaped silicon layer 109, a third n+ silicon layer 121 formed on the upper part of the second island-shaped silicon layer 109, a fourth n+ silicon layer 137 formed on the lower part of the second island-shaped silicon layer 109, a second p silicon layer 162 formed between the third n+ silicon layer 121 and the fourth n+ silicon layer 137, a second gate insulating film 115 formed surrounding the second p silicon layer 162, and a second gate electrode 127 formed surrounding the second gate insulating film 115 and composed of at least a metal.

The static memory cell further includes a first load transistor 102, and a first gate wire 132 connected to the second gate electrode 127, and the first load transistor 102 includes a third island-shaped silicon layer 108, a third p+ silicon layer 120 formed on the upper part of the third island-shaped silicon layer 108, a fourth p+ silicon layer 136 formed on the lower part of the third island-shaped silicon layer 108, a fifth n silicon layer 161 formed between the third p+ silicon layer 120 and the fourth p+ silicon layer 136, a third gate insulating film 114 formed surrounding the fifth n silicon layer 161, and a third gate electrode 126 formed surrounding the third gate insulating film 114 and composed of at least a metal.

Since a threshold voltage of a transistor is determined by work function, an electrode to be used as a gate electrode is desirably formed of at least a metal or a metal compound.

In addition, the static memory cell has a gate wire 131 connected to the first gate electrode 125 and the third gate electrode 126, and a wiring 141 that connects the second n+ silicon layer 135, the fourth n+ silicon layer 137, and the fourth p+ silicon layer 136 to one another.

The line 141 is preferably formed of silicon or a compound of metal and silicon.

The static memory cell further includes a driver transistor 106, and the driver transistor 106 includes an island-shaped silicon layer 112, an n+ silicon layer 124 formed on the upper part of the island-shaped silicon layer 112, an n+ silicon layer 140 formed on the lower part of the island-shaped silicon layer 112, a p silicon layer 165 formed between the n+ silicon layer 124 and the n+ silicon layer 140, a gate insulating film 118 formed surrounding the p silicon layer 165, and a gate electrode 130 formed surrounding the gate insulating film 118 and composed of at least a metal.

The static memory cell further includes a selection transistor 104, and the selection transistor 104 includes an island-shaped silicon layer 110, an n+ silicon layer 122 formed on the upper part of the island-shaped silicon layer 110, an n+ silicon layer 138 formed on the lower part of the island-shaped silicon layer 110, a p silicon layer 163 formed between the n+ silicon layer 122 and the n+ silicon layer 138, a gate insulating film 116 formed surrounding the p silicon layer 163, and a gate electrode 128 formed surrounding the gate insulating film 116 and composed of at least a metal.

The static memory cell further includes a load transistor 105 and a gate wire 133 connected to the gate electrode 128, and the load transistor 105 includes an island-shaped silicon layer 111, a p+ silicon layer 123 formed on the upper part of the island-shaped silicon layer 111, a p+ silicon layer 139 formed on the lower part of the island-shaped silicon layer 111, an n silicon layer 164 formed between the p+ silicon layer 123 and the p+ silicon layer 139, a gate insulating film 117 formed surrounding the n+ silicon layer 164, and a gate electrode 129 formed surrounding the gate insulating film 117 and composed of at least a metal.

Since a threshold voltage of a transistor is determined by work function, an electrode to be used as a gate electrode is desirably at least formed of a metal or a metal compound.

In addition, the static memory cell has a gate wire 134 connected to the gate electrode 129 and the gate electrode 130, and a wiring 142 that connects the n+ silicon layer 140, the n+ silicon layer 138, and the p+ silicon layer 139 to one another.

The line 142 is preferably formed of silicon or a compound of metal and silicon.

In this case, the first island-shaped silicon layer 107 has a peripheral length W1 less than twice a peripheral length W2 of the second island-shaped silicon layer 109, and a voltage to be applied to the second gate electrode 127 is lower than a voltage to be applied to the third n+ silicon layer 121.

The peripheral length W1 of the first island-shaped silicon layer 107 is made less than twice the peripheral length W2 of the second island-shaped silicon layer 109 to thereby prevent an increase in the area occupied by the first driver transistor 101 and prevent an increase in the memory cell area. While the term "less than twice" has been used, it is particularly desirable that W1=W2. The reason for this is that, in this case, the area occupied by the first driver transistor 101 is made equal to the area occupied by the first selection transistor 103 and the degree of integration can be increased.

Furthermore, a voltage lower than the voltage to be applied to the third n+ silicon layer 121 of the first selection transistor 103 is applied to the second gate electrode 127 of the first selection transistor 103 to thereby reduce the current driving force of the first selection transistor 103. A static memory cell with a high degree of integration and operational stability ensured can be provided.

Figure 4:
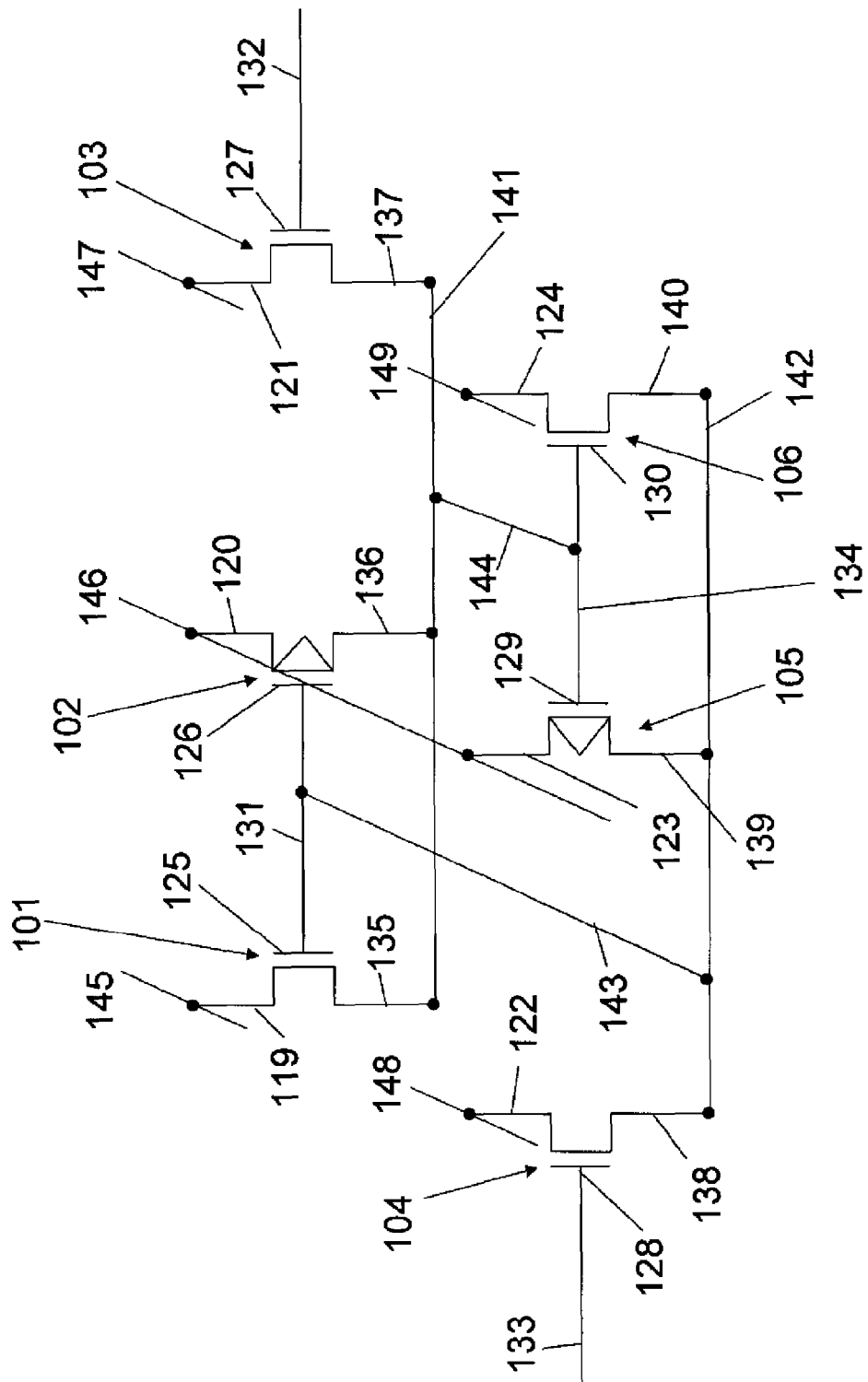
FIG. 4 is a circuit diagram of the static memory cell according to the present invention.

FIG. 4 illustrates a circuit diagram of the static memory cell according to the present invention.

The gate wire 131 and the line 142 are connected to each other via a wiring or contact 143, and the gate wire 134 and the line 141 are connected to each other via a wiring or contact 144. A GND line 145 is connected to the first n+ silicon layer 119, and a power supply line 146 is connected to the third p+ silicon layer 120. Further, a bit line 147 is connected to the third n+ silicon layer 121, and a GND line 149 is connected to the n+ silicon layer 124. The power supply line 146 is connected to the p+ silicon layer 123, and a bit line 148 is connected to the n+ silicon layer 122.

Figure 5:
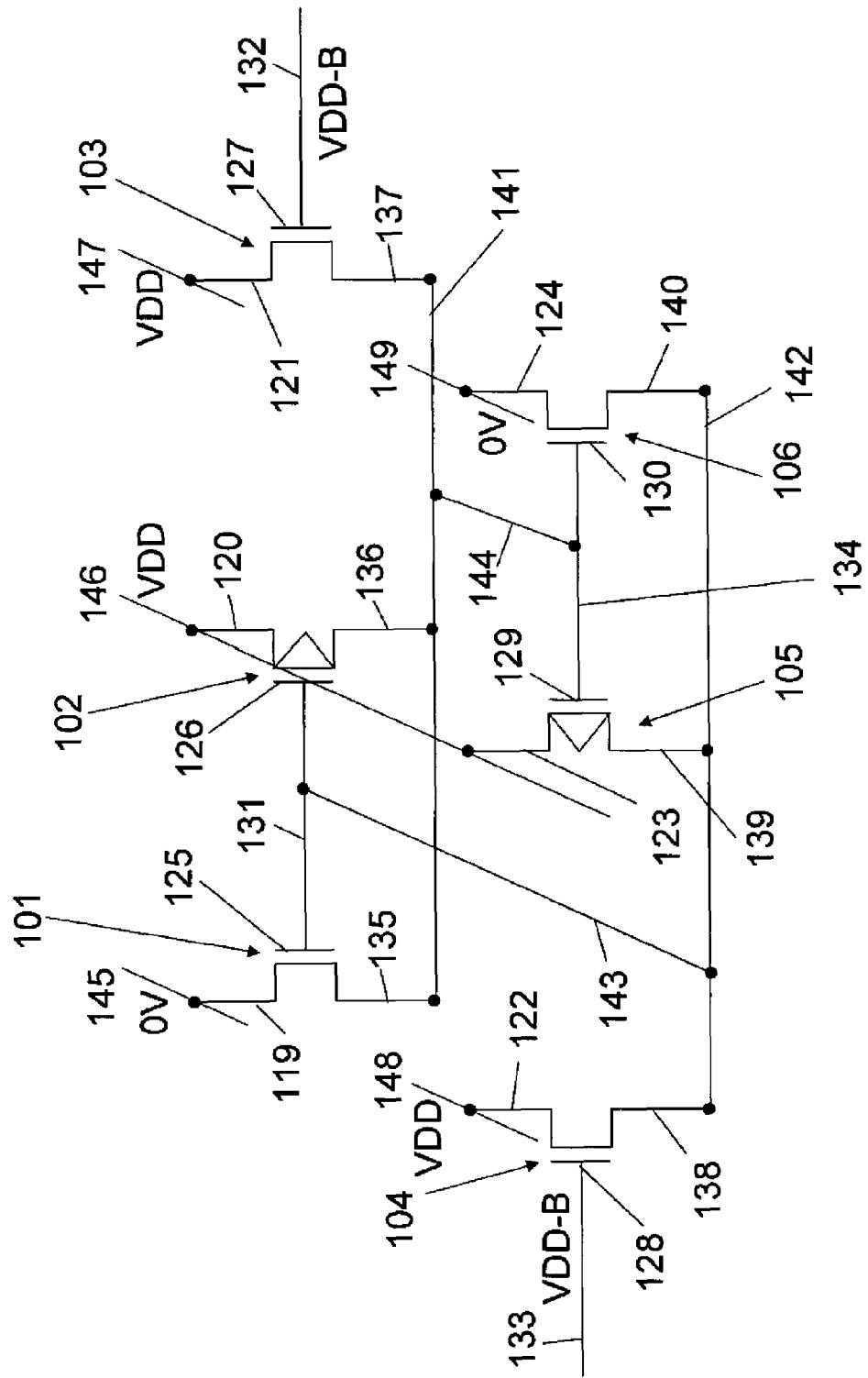
FIG. 5 is a circuit diagram of the static memory cell according to the present invention.

FIG. 5 illustrates a circuit diagram of the static memory cell according to the present invention.

A voltage applied when data is read according to the present invention is illustrated in FIG. 4. A voltage VDD-B is applied to the first gate wire 132 and the second gate electrode 127. VDD represents a power supply voltage. B represents a positive number. The power supply voltage VDD is applied to a bit line. Therefore, a voltage lower than a voltage to be applied to the third n+ silicon layer 121 of the first selection transistor 103 is applied to the second gate electrode 127 of the first selection transistor 103 to thereby reduce the current driving force of the first selection transistor 103. A static memory cell with a high degree of integration and operational stability ensured can be provided.

Figure 6:
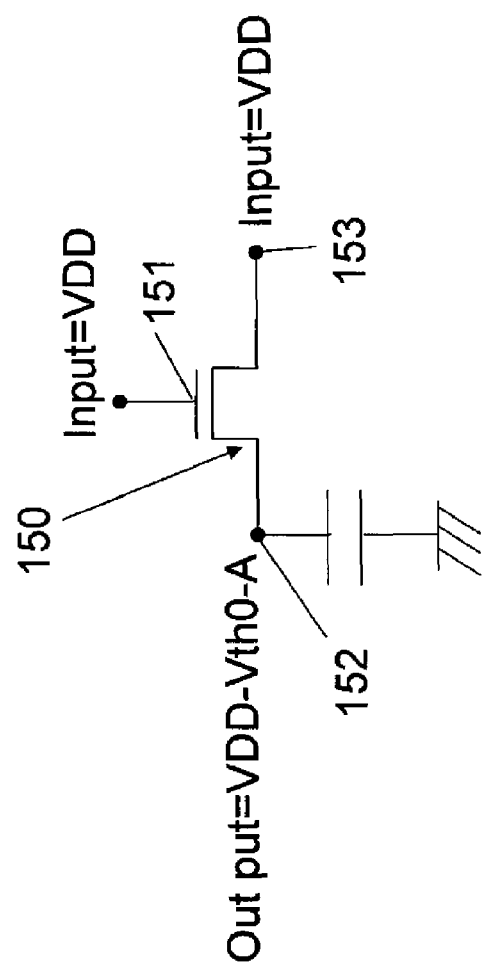
FIG. 6 is a circuit diagram of a pass transistor according to the present invention.

In this case, a voltage drop circuit is required to create the voltage VDD-B. If the voltage drop circuit has a large area, a high degree of integration may not be realized. Thus, a circuit configuration capable of achieving a voltage drop with a minimum area is necessary. FIG. 6 is a circuit diagram of a pass transistor according to the present invention. Upon receiving as input the power supply voltage VDD at the drain and the power supply voltage VDD at the gate, the pass transistor outputs from the source a value obtained by subtracting a threshold voltage (Vth0+A) from the power supply voltage VDD, where Vth0 denotes a threshold voltage when the voltage at the source is 0 V, and A denotes an increase over the threshold voltage that has been increased due to the back-bias effect.

Figure 7:
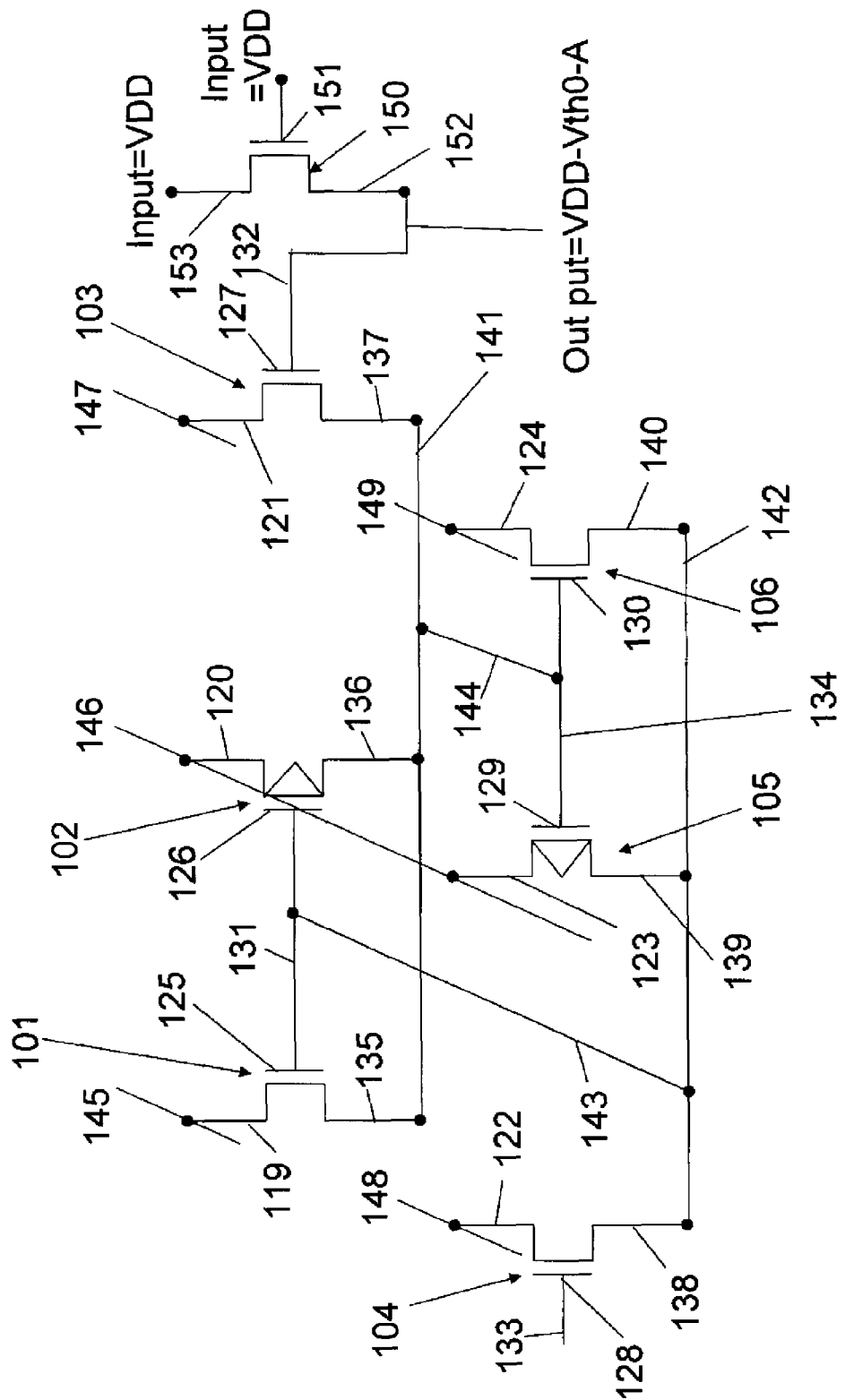
FIG. 7 is a circuit diagram of the static memory cell and the pass transistor according to the present invention.

The above-described pass transistor is added to the static memory cell according to the present invention. FIG. 7 is a circuit diagram of the static memory cell and the pass transistor according to the present invention. The pass transistor may not necessarily be provided for each static memory cell but may be provided at an end of a word line, and may be provided at an end of a static memory cell array. That is, at least one pass transistor may be provided for each word line, and therefore the space for the voltage drop circuit can be reduced.

Upon receiving as input the power supply voltage VDD at the drain and the power supply voltage VDD at the gate, the pass transistor outputs from the source a value obtained by subtracting the threshold voltage (Vth0+A) from the power supply voltage VDD, where Vth0 denotes a threshold voltage when the voltage at the source is 0 V and A denotes an increase over the threshold voltage that has been increased due to the back-bias effect. Therefore, the increase A over the threshold voltage that has been increased due to the back-bias effect changes with the back bias.

Figure 8:
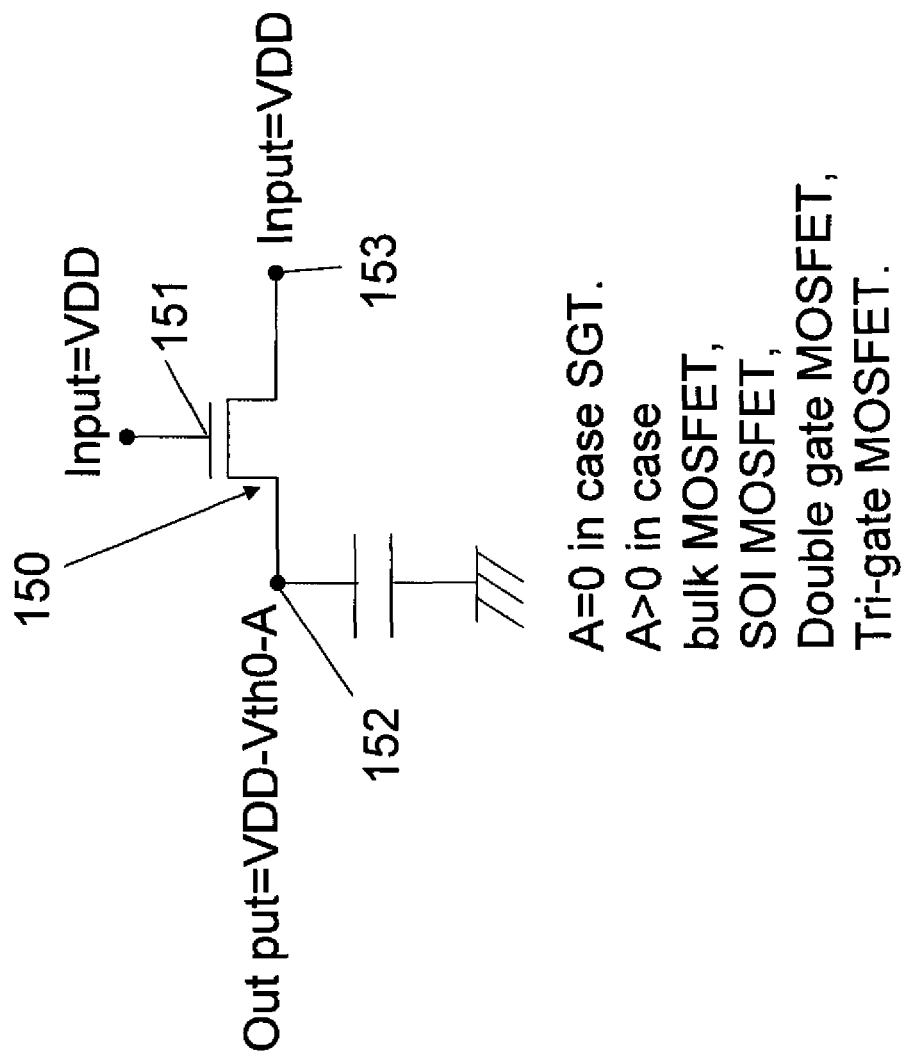
FIG. 8 is a circuit diagram of the pass transistor according to the present invention.

FIG. 8 is a circuit diagram of the pass transistor according to the present invention.

Since bulk MOSFETs, SOI MOSFETs, double gate MOSFETs, and Tri-gate MOSFETs have a body which is not completely covered by the gate, in principle, the threshold voltage is increased due to the back-bias effect. The increase A over the threshold voltage that has been increased due to the back-bias effect is a positive number. That is, if a bulk MOSFET, a SOI MOSFET, a double gate MOSFET, or a Tri-gate MOSFET is used as a pass transistor according to the present invention, operational stability is impaired because the threshold voltage changes with the source voltage.

In contrast, since SGTs have a body which is completely covered by the gate, in principle, the threshold voltage is not changed due to the back-bias effect. The increase A over the threshold voltage that has been increased due to the back-bias effect is 0. That is, the threshold voltage can always be kept constant. With the use of an SGT as a pass transistor, a static memory cell with operational stability ensured can be provided.

Therefore, an SGT is used as a pass transistor.

Figure 9:
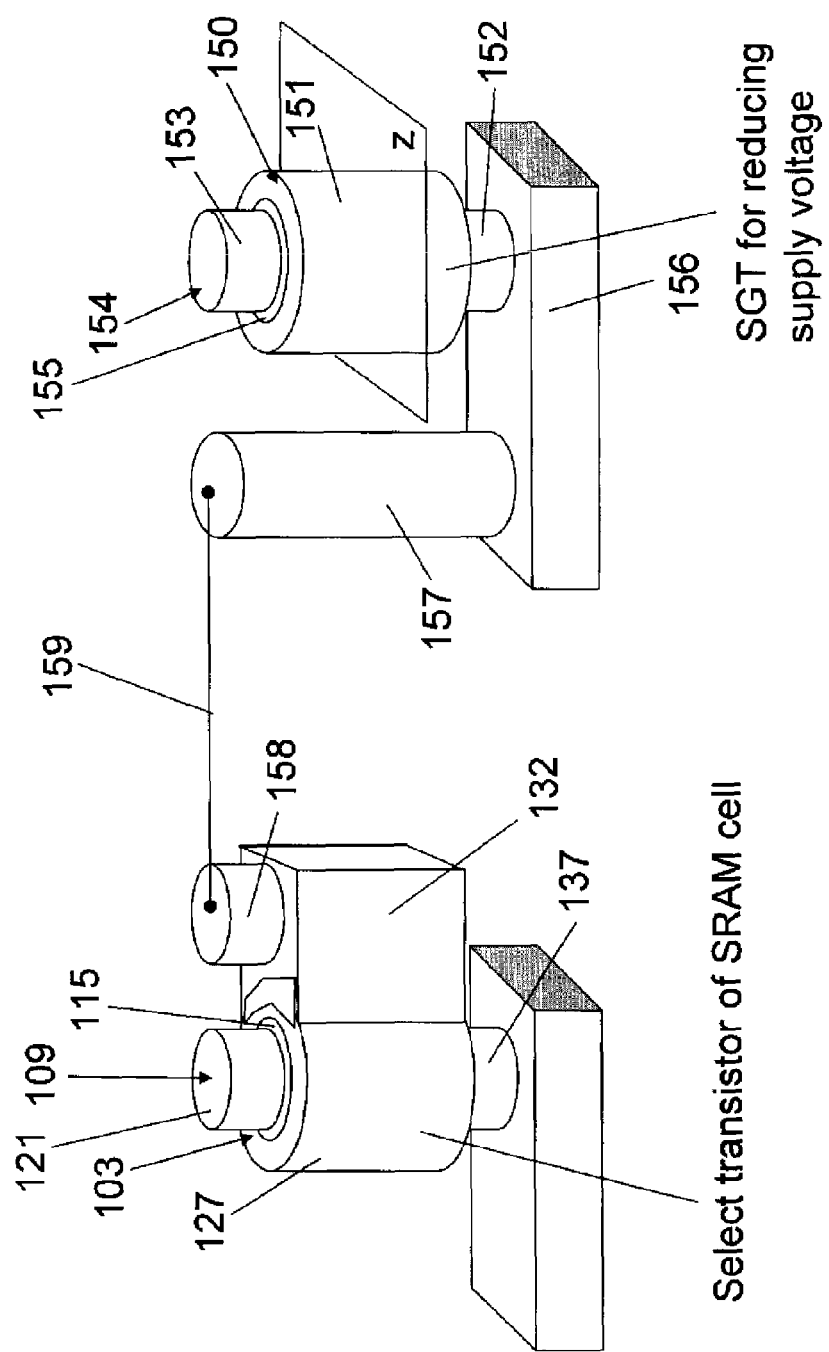
FIG. 9 is an overall view of a selection transistor and the pass transistor according to the present invention.

FIG. 9 is an overall view of the selection transistor and the pass transistor according to the present invention.

Figure 10:
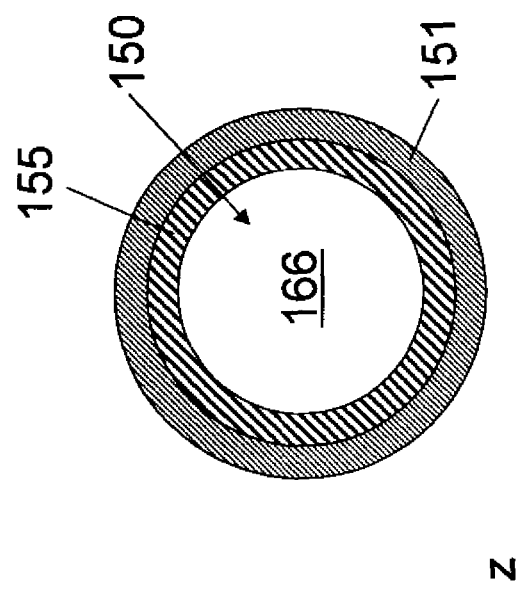
FIG. 10 is a cross-sectional view of the pass transistor according to the present invention, taken along the plane z in FIG. 9.

FIG. 10 is a cross-sectional view of the pass transistor according to the present invention, taken along the plane z in FIG. 9.

The static memory cell further includes a first pass transistor 150, and the first pass transistor 150 includes a fourth island-shaped silicon layer 154, a sixth n+ silicon layer 153 formed on the upper part of the fourth island-shaped silicon layer 154, a seventh n+ silicon layer 152 formed on the lower part of the fourth island-shaped silicon layer 154, a fifth p silicon layer 166 formed between the sixth n+ silicon layer 153 and the seventh n+ silicon layer 152, a fourth gate insulating film 155 formed surrounding the fifth p silicon layer 166, and a fourth gate electrode 151 formed surrounding the fourth gate insulating film 155 and composed of at least a metal.

The seventh n+ silicon layer 152 and the first gate wire 132 are connected to each other via a wiring 156, a contact 157, a wiring 159, and a contact 158, and a power supply voltage is applied to the sixth n+ silicon layer 153.

The above-described SGT pass transistor may not necessarily be provided for each static memory cell but may be provided at an end of a word line, and may be provided at an end of a static memory cell array. That is, at least one SGT pass transistor may be provided for each word line, and therefore the space for the voltage drop circuit can be reduced.

Further, since SGTs have a body which is completely covered by the gate, in principle, the threshold voltage is not increased due to the back-bias effect. The increase A over the threshold voltage that has been increased due to the back-bias effect is 0. That is, the threshold voltage can always be kept constant. With the use of an SGT as a pass transistor, a static memory cell with operational stability ensured can be provided.

In addition, the sixth n+ silicon layer 153 and the first gate wire 132 may be connected to each other via a wiring, and a power supply voltage may be applied to the seventh n+ silicon layer 152.

Since a threshold voltage of a transistor is determined by work function, an electrode to be used as the gate electrode of the SGT pass transistor is desirably formed of at least a metal or a metal compound.

Further, if the current driving force of the SGT pass transistor is not sufficient, a plurality of SGT pass transistors may be used.

Various embodiments and modifications can be made to the present invention without departing from the broad spirit and scope of the present invention. The foregoing embodiment describes an example of the present invention, and the technical scope of the present invention is not limited by the foregoing embodiment. Further, it is obvious to a person skilled in the art that reversing p type (including p+ type) and n type (including n+ type) to opposite respective conductivity types in the foregoing description also falls within the technical scope of the present invention.

The invention claimed is:

1. A semiconductor device forming at least part of a six-transistor SRAM cell, comprising:
   a first driver transistor including
      a first island-shaped semiconductor layer,
      a first first-conductivity-type high-concentration semiconductor layer formed on the upper part of the first island-shaped semiconductor layer,
      a second first-conductivity-type high-concentration semiconductor layer formed on the lower part of the first island-shaped semiconductor layer,
      a first second-conductivity-type semiconductor layer formed between the first first-conductivity-type high-concentration semiconductor layer and the second first-conductivity-type high-concentration semiconductor layer,
      a first gate insulating film formed surrounding the first second-conductivity-type semiconductor layer, and
      a first gate electrode formed surrounding the first gate insulating film and composed of at least a metal;
   a first selection transistor including
      a second island-shaped semiconductor layer,
      a third first-conductivity-type high-concentration semiconductor layer formed on the upper part of the second island-shaped semiconductor layer,
      a fourth first-conductivity-type high-concentration semiconductor layer formed on the lower part of the second island-shaped semiconductor layer,
      a second second-conductivity-type semiconductor layer formed between the third first-conductivity-type high-concentration semiconductor layer and the fourth first-conductivity-type high-concentration semiconductor layer,
      a second gate insulating film formed surrounding the second second-conductivity-type semiconductor layer, and
      a second gate electrode formed surrounding the second gate insulating film and composed of at least a metal;
   a first load transistor including
      a third island-shaped semiconductor layer,
      a third second-conductivity-type high-concentration semiconductor layer formed on the upper part of the third island-shaped semiconductor layer,
      a fourth second-conductivity-type high-concentration semiconductor layer formed on the lower part of the third island-shaped semiconductor layer,
      a fifth first-conductivity-type semiconductor layer formed between the third second-conductivity-type high-concentration semiconductor layer and the fourth second-conductivity-type high-concentration semiconductor layer,
      a third gate insulating film formed surrounding the fifth first-conductivity-type semiconductor layer, and
      a third gate electrode formed surrounding the third gate insulating film and composed of at least a metal, and
   a first gate wire connected to the second gate electrode, and wherein: said first island-shaped semiconductor layer has a peripheral length less than twice a peripheral length of said second island-shaped semiconductor layer, and a voltage to be applied to said second gate electrode is lower than a voltage to be applied to said third first-conductivity-type high-concentration semiconductor layer when data is read;

a second driver transistor including
- a fifth island-shaped semiconductor layer,
- a eighth first-conductivity-type high-concentration semiconductor layer formed on the upper part of the fifth island-shaped semiconductor layer,
- a ninth first-conductivity-type high-concentration semiconductor layer formed on the lower part of the fifth island-shaped semiconductor layer,
- a sixth second-conductivity-type semiconductor layer formed between the eighth first-conductivity-type high-concentration semiconductor layer and the ninth first-conductivity-type high-concentration semiconductor layer,
- a fifth gate insulating film formed surrounding the sixth second-conductivity-type semiconductor layer, and
- a fifth gate electrode formed surrounding the fifth gate insulating film and composed of at least a metal;

a second selection transistor including
- a sixth island-shaped semiconductor layer,
- a tenth first-conductivity-type high-concentration semiconductor layer formed on the upper part of the sixth island-shaped semiconductor layer,
- a eleventh first-conductivity-type high-concentration semiconductor layer formed on the lower part of the sixth island-shaped semiconductor layer,
- a seventh second-conductivity-type semiconductor layer formed between the tenth first-conductivity-type high-concentration semiconductor layer and the eleventh first-conductivity-type high-concentration semiconductor layer,
- a sixth gate insulating film formed surrounding the seventh second-conductivity-type semiconductor layer, and
- a sixth gate electrode formed surrounding the sixth gate insulating film and composed of at least a metal;

a second load transistor including
- a seventh island-shaped semiconductor layer,
- a eighth second-conductivity-type high-concentration semiconductor layer formed on the upper part of the seventh island-shaped semiconductor layer,
- a ninth second-conductivity-type high-concentration semiconductor layer formed on the lower part of the seventh island-shaped semiconductor layer,
- a twelfth first-conductivity-type semiconductor layer formed between the eighth second-conductivity-type high-concentration semiconductor layer and the ninth second-conductivity-type high-concentration semiconductor layer,
- a seventh gate insulating film formed surrounding the twelfth first-conductivity-type semiconductor layer, and
- a seventh gate electrode formed surrounding the seventh gate insulating film and composed of at least a metal; and a second gate wire connected to the sixth gate electrode, and wherein:
the second first-conductivity-type high-concentration semiconductor and the fourth first-conductivity-type high-concentration semiconductor layer and the fourth second-conductivity-type high-concentration semiconductor are connected, the first gate electrode and the third gate electrode are connected, the ninth first-conductivity-type high-concentration semiconductor layer and the eleventh first-conductivity-type high-concentration semiconductor and the ninth second-conductivity-type high-concentration semiconductor are connected, and the fifth gate electrode and the seventh gate electrode are connected.

2. The semiconductor device according to claim 1, further comprising a first pass transistor including:
- a fourth island-shaped semiconductor layer,
- a sixth first-conductivity-type high-concentration semiconductor layer formed on the upper part of the fourth island-shaped semiconductor layer,
- a seventh first-conductivity-type high-concentration semiconductor layer formed on the lower part of the fourth island-shaped semiconductor layer,
- a fifth second-conductivity-type semiconductor layer formed between the sixth first-conductivity-type high-concentration semiconductor layer and the seventh first-conductivity-type high-concentration semiconductor layer,
- a fourth gate insulating film formed surrounding the fifth second-conductivity-type semiconductor layer, and
- a fourth gate electrode formed surrounding the fourth gate insulating film and composed of at least a metal,
- a wiring connecting said seventh first-conductivity-type high-concentration semiconductor layer and said first gate wire to one another, and wherein:
- a power supply voltage is applied to said sixth first-conductivity-type high-concentration semiconductor layer; and
- a voltage lower than the power supply voltage is output to said seventh first-conductivity-type high-concentration semiconductor layer.

3. The semiconductor device according to claim 2, wherein a voltage to be applied to said fourth gate electrode is the power supply voltage.

4. . The semiconductor device according to claim 1, further comprising a first pass transistor including:
- a fourth island-shaped semiconductor layer,
- a sixth first-conductivity-type high-concentration semiconductor layer formed on the upper part of the fourth island-shaped semiconductor layer,
- a seventh first-conductivity-type high-concentration semiconductor layer formed on the lower part of the fourth island-shaped semiconductor layer,
- a fifth second-conductivity-type semiconductor layer formed between the sixth first-conductivity-type high-concentration semiconductor layer and the seventh first-conductivity-type high-concentration semiconductor layer,
- a fourth gate insulating film formed surrounding the fifth second-conductivity-type semiconductor layer, and
- a fourth gate electrode formed surrounding the fourth gate insulating film and composed of at least a metal,
- a wiring connecting said sixth first-conductivity-type high-concentration semiconductor layer and said first gate wire to one another, and wherein:
- a power supply voltage is applied to said seventh first-conductivity-type high-concentration semiconductor layer, and
- a voltage lower than the power supply voltage is output to said sixth first-conductivity-type high-concentration semiconductor layer.

5. The semiconductor device according to claim 4, wherein a voltage to be applied to said fourth gate electrode is the power supply voltage.

\* \* \* \* \*